United States Patent [19]

Firtion et al.

[11] E Re. 31,053

[45] Reissued Oct. 12, 1982

[54] APPARATUS AND METHOD FOR HOLDING AND PLANARIZING THIN WORKPIECES

[75] Inventors: Victor A. Firtion, Secaucus; Donald R. Herriott, Morris Township, Morris County; Martin E. Poulsen, New Providence; Leif Rongved, Convent Station; Thomas E. Saunders, Basking Ridge, all of N.J.

[73] Assignee: Bell Telephone Laboratories, Incorporated, Murray Hill, N.J.

[21] Appl. No.: 259,596

[22] Filed: May 1, 1981

Related U.S. Patent Documents

Reissue of:

[64] Patent No.: 4,213,698
Issued: Jul. 22, 1980
Appl. No.: 965,304
Filed: Dec. 1, 1978

U.S. Applications:

[63] Continuation-in-part of Ser. No. 871,477, Jan. 23, 1978, abandoned.

[51] Int. Cl.[3] ..... G03B 29/00; B25B 11/00; B23Q 7/00

[52] U.S. Cl. ..... 355/77; 29/559; 29/569 R; 51/235; 269/21; 430/396

[58] Field of Search ..... 29/559, 569 R; 51/235; 269/21; 279/3; 355/77; 430/396

[56] References Cited

U.S. PATENT DOCUMENTS

| | | | |
|---|---|---|---|
| 1,121,452 | 12/1914 | Bagnall | 279/3 UX |
| 3,627,338 | 12/1971 | Thompson | 279/3 |
| 3,652,075 | 3/1972 | Thompson | 269/21 |
| 3,747,282 | 7/1973 | Katzke | 51/235 |
| 3,765,289 | 10/1973 | Gerber et al. | 83/452 |
| 3,815,221 | 6/1974 | Pearl | 29/559 |
| 3,853,313 | 12/1974 | Appenzeller et al. | 269/21 |
| 4,046,474 | 9/1977 | Lee | 355/77 X |
| 4,088,312 | 5/1978 | Frosch | 269/21 |

FOREIGN PATENT DOCUMENTS

| | | | |
|---|---|---|---|
| 1286466 | 12/1960 | Fed. Rep. of Germany | 279/3 |

*Primary Examiner*—Charlie T. Moon
*Attorney, Agent, or Firm*—Lucian C. Canepa

[57] ABSTRACT

An apparatus and method for holding a thin workpiece such as a semiconductor wafer for operations which require the workpiece to have a high degree of planarity such as photolithographic printing includes positioning the workpiece onto a planar holding face comprising the points of a multiplicity of regularly spaced-apart substantially parallel pins with a thin rim encompassing all pins to contain a vacuum in the region adjacent to the workpiece. The small abutting area of each pinpoint abutment reduces the probability of dirt particles collecting on the holding face and provides a high thrust pressure to dislodge dirt particles interposed between the abutment and the workpiece. A small amount of lateral motion is imparted to the workpiece when it first contacts the holding face to brush off any dirt particles on the abutments.

6 Claims, 4 Drawing Figures

APPARATUS AND METHOD FOR HOLDING AND PLANARIZING THIN WORKPIECES

Matter enclosed in heavy brackets [ ] appears in the original patent but forms no part of this reissue specification; matter printed in italics indicates the additions made by reissue.

CROSS-REFERENCE TO RELATED APPLICATION

This application is a continuation-in-part of our copending application, Ser. No. 871,477, filed Jan. 23, 1978, now abandoned.

BACKGROUND OF THE INVENTION

This invention relates to apparatus and method for holding and planarizing thin workpieces, and more specifically to vacuum apparatus for holding semiconductor wafers during pattern exposure in photolithography.

The invention also relates to a method for fabricating devices on a semiconductive wafer by utilizing such an apparatus.

Recent advances in large scale integration (LSI) of semiconductor circuits have been made possible largely by higher resolution photolithography which permits finer features to be patterned onto a semiconductor surface. Consequently circuit components can be made smaller, thus making it possible to place an increasing number of components onto a single semiconductor chip. The results are circuits of greater complexity, higher speed, lower power dissipation and lower cost.

As a practical matter, the feature size limitations in photolithography are not usually imposed by the resolution capabilities of the optical components nor by that of the photoresist, but rather by the flatness or planarity of the semiconductor surface being patterned. The consequence of nonplanarity is distortion of the pattern being exposed and an error in the focal position. Surface planarity is particularly important when projection printing is used where, to achieve the maximum resolution capability of the projection optics, the semiconductor surface being exposed must be made essentially coincident with the focal plane of the projection optics. Deviations of the surface from the focal plane must not exceed the depth of focus of the optical system. For example, if the total depth of focus were 10 microns, then to achieve maximum resolution, the semiconductor surface including a photoresist film approximately one micron thick must be maintained planar to within 10 mircons during pattern exposure. A high degree of surface planarity is also required to achieve freedom from pattern distortion in contact printing and maximum pattern resolution in proximity printing although the requirement is not as critical as for projection printing.

Nonplanarity in semiconductor wafers may be separated into two sources. The first is that of nonlinear thickness variations in the wafer. Normally during pattern exposure, one surface of the wafer (back surface) is forced to substantially conform to a planar surface by some wafer holding apparatus. Thus, the other surface of the wafer (front surface) would be planar if the wafer had no nonlinear thickness variation. Notice that if the wafer had a linear thickness variation (e.g. a wedge shape), its front surface would still be planar although it would not be parallel with the back surface. This can be tolerated by most projection and proximity printing systems which have means for tilting the wafer surface to make it parallel to the optical plane of the printing system. But, if the wafer had a nonlinear thickness variation, its front surface would be nonplanar. However, nonlinear thickness variations can be reduced to an acceptable degree by careful wafer fabrication.

The second source of nonplanarity in semiconductor wafers is that of warpage. Owing to the thinness of semiconductor wafers used for intergrated circuit processing, some warpage is always present. A typical three inch diameter silicon wafer which has a thickness of fifteen to twenty thousandths of an inch may exhibit a warpage of as much as two thousandths of an inch or approximately fifty microns. Warpage is first introduced when the wafer is sawed from the boule. Because the thin wafer is rather springy, the warpage is not removed by the subsequent lapping and polishing steps in the wafer fabrication process. Furthermore, the furnace sequences and the growth and deposition of various films on the wafer surface during the device fabrication process may all aggravate the warpage.

The usual method for removing wafer warpage during pattern exposure is to hold the wafer on a vacuum holding apparatus with a highly planar holding face. Thus, if the wafer warpage where not too severe, (less than fifty microns), and if the wafer had minimal nonlinear thickness variation, the vacuum holding apparatus would in principle cause the front surface to have a high order of planarity.

However, a problem arises when dirt particles become interposed between the wafer and the holding face to prevent intimate contact. Since the size of dirt particles may be ten microns in diameter or greater, their effect is to cause the wafer front surface to deviate sufficiently from planarity to produce pattern distortion during photolithographic exposure. The problem of dirt particles is especially difficult to solve in a manufacturing environment where the necessity to maintain a high throughput of wafers through each photolithographic step renders any cleaning procedure to remove dirt particles from the wafer and the wafer holder impractical. Moreover, removal of particulates from the air as in an "ultra-clean room" environment does not completely solve the problem as most of the dirt particles come from the wafers themselves in the form of chips from the wafer edges and flakes from films grown or deposited on the wafer surface. A broken wafer causes the most severe contamination of particles.

Vacuum fixtures for holding thin workpieces are disclosed in U.S. Pat. Nos. 3,627,338, and 3,747,282. Both patents disclose vacuum chucks where the workpiece holding face comprises a planar surface with annular and radial grooves for distributing vacuum to the back surface of the workpiece. Furthermore, these known fixtures were apparently devised for applications in machining and polishing of thin workpieces where the requirements for workpiece planarity is not as critical as for photolithography. Therefore, none of the above-mentioned disclosures offers any solutions to the problems arising from the wafer planarity requirements imposed by photolithography and the detrimental effects of dirt particles on achieving that planarity.

From the foregoing, a need clearly exists for a vacuum wafer holding apparatus and wafer planarization method which is substantially immune to dirt particles which are always present in a semiconductor device manufacturing environment.

SUMMARY OF THE INVENTION

Accordingly, one object of the present invention is to provide a vacuum wafer holding apparatus and wafer planarization method which would meet the aforedescribed need.

Another object of the present invention is to provide a vacuum wafer holding apparatus and wafer planarization method which would improve the actual resolution capabilities of a photolithographic system in a manufacturing environment.

Still another object of the present invention is to provide a vacuum wafer holding apparatus and a fabrication method which would improve the manufacturing yield of LSI integrated circuits.

These and other objectives will become apparent from the following description of the preferred embodiment of the invention which is of a vacuum holding apparatus having a planar holding face comprising the points of a plurality of regularly spaced-apart substantially equal height pins mounted perpendicularly in a circular baseplate. The baseplate has a thin raised rim of the same height as the pins. The edge of the rim has a smooth planar surface which forms part of the holding face. The workpiece is positioned over the holding face with its edges overlapping the rim. The rim edge forms a substantially airtight seal against the workpiece creating an evacuable chamber enclosed by the baseplate, the rim, and the workpiece. The chamber is evacuated through an opening in the baseplate, the vacuum creating a pressure difference between the front and back workpiece surfaces giving rise to a net force uniformly distributed along the front surface which causes the workpiece to conform to the holding face. The pinpoint abutments of the holding face exert counterbalancing localized forces against the back surface to hold the workpiece in place. Owing to the small area of each pinpoint abutment, it is highly improbable that a dirt particle would collect on it. The few dirt particles that do collect on the pinpoints would normally be brushed off by any slight lateral motion of the wafer when it is positioned on the holding face. The extent of this lateral motion would determine the largest dimension which an abutment may have and still insure that a dirt particle situated on the abutment will be brushed off. It has been found that in a manufacturing environment, the minimum lateral motion of a wafer being positioned over a holding face is about fifty thousandths of an inch. Furthermore, the small area of the pinpoints would also tend to squeeze out any dirt particles which remain after the wafer is in place.

*Another aspect of the present invention is a method of improving the planarity of a substrate wafer during photolithography by making advantageous use of the lateral motion which is normally imparted to the wafer as it is loaded onto a holding face to prevent dirt particles from becoming interposed between the wafer and the holding face. By supporting the wafer with a holding face comprising a multiplicity of pinpoint abutments each having a maximum dimension which is less than the extent of the lateral motion of the wafer, dirt particles on the holding face are brushed off when the wafer is loaded.*

BRIEF DESCRIPTION OF THE DRAWING

The invention will be better understood from the more detailed description taken in conjunction with the accompanying drawing in which.

DETAILED DESCRIPTION

Figure 1:
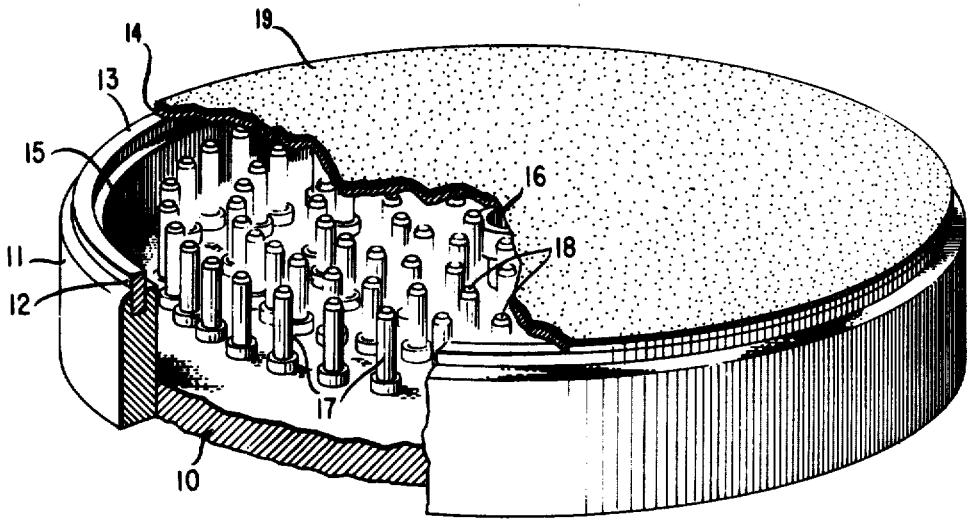
FIG. 1 is a schematic representation of a vacuum holding apparatus in accordance with the preferred embodiment of the invention.
Figure 2:
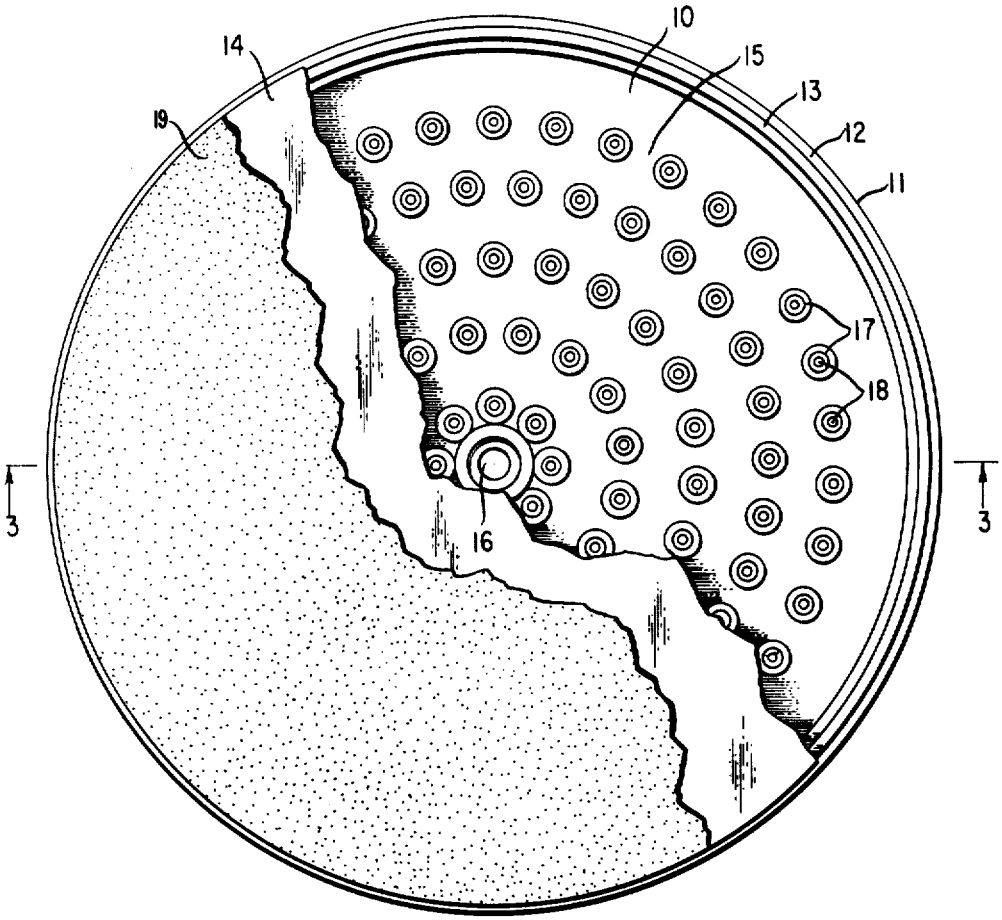
FIG. 2 is a top view of the embodiment of FIG. 1.
Figure 3:
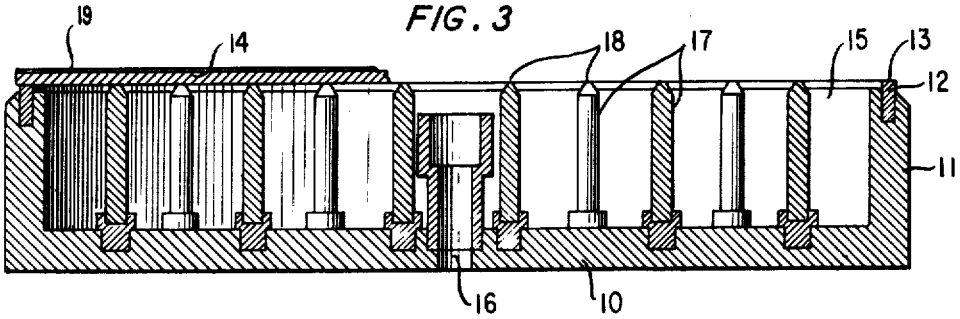
FIG. 3 is a view taken along lines 4—4 of FIG. 2.

Referring now to FIGS. 1, 2 and 3, there is shown a schematic of the preferred embodiment of the invention comprising a generally circular baseplate 10 having a raised rim 11. The rim includes a press-fitted insert 12 to provide a narrow edge 13 which has a smooth top planar surface for supporting the periphery of the back surface of a thin workpiece such as a semiconductor wafer 14 having a resist layer, 19, coated thereon, the diameter of the rim being smaller than that of the workpiece to allow the workpiece edge to overhang the rim. In a typical embodiment intended to hold 3 inch diameter wafers, the outside diameter of the rim is 2.86 inches. The rim edge makes a substantially airtight seal with the back surface of the workpiece thereby forming an evacuable chamber 15. The chamber communicates with a vacuum pump through a vacuum passage 16 in the baseplate. Mounted in the baseplate and substantially perpendicular thereto are a plurality of regularly spaced-apart rigid cylindrical pins 17 with tapered points 18. The pinpoints together wtih the rim edge form the holding face against which the back surface of the workpiece is held when the chamber 15 is evacuated.

The pinpoints provide localized abutments whose areas can be made much smaller than that of the distributed abutments in prior art vacuum chucks which comprise annular strips of "land" between vacuum distributing grooves on the holding face of the chuck.

The heights of the pins 17 and the rim 11 must all be substantially the same to give the holding face a high degree of planarity. In the preferred embodiment the planarity is achieved by lapping the entire holding face after its construction. Thus, the holding face is made planar to a fraction of a micron over a circular region approximately three inches in diameter.

Since one principle of the invention is to decrease the probability of dirt particles collecting on the holding face by reducing its area, the holding face should be composed of as few pinpoints as possible. However, the pinpoints must not be spaced so far apart to allow the unsupported regions of the workpiece to distort under the force created by the vacuum, as that would defeat the main objective of the invention to maintain workpiece surfaces at a high degree of planarity. The optimal spacing between adjacent pinpoints depends on the thickness of the workpiece and the mechanical characteristics of the workpiece material. This spacing can be readily calculated by a person skilled in the art. An example of how such a calculation is made can be found in Advance Strength of Materials, J. P. DenHartog, published in 1952 by McGrawHill Book Co. (see page 128). In a specific illustrative embodiment intended for holding silicon wafers three inches in diameter and twenty thousandths of an inch thick, the spacing between adjacent pinpoints in the holding face is two-tenths of an inch. The diameters of semiconductor wafers used in device fabrication may vary, and in general the wafer thickness increases with increasing wafer diameter. In accordance with the principles of the invention, apparatus can be designed to hold wafers of any diameter.

Another principle of the invention is to reduce the area of each individual abutment in the holding face and thereby increase the probability that a dirt particle would be brushed off during the workpiece loading operation and that the thrust of the small localized abutment would squeeze out a dirt particle which becomes interposed between the abutment and the workpiece. In practice the smallness of the abutting area depends on the abutment material, the fabrication method for the pins, the method used to planarize the holding face and the rate of abrasion of the abutment used. In the preferred embodiment which has alumina pins with ground points, and in which the holding face is planarized by lapping, the pinpoints have diameters between ten and fifteen thousandths of an inch. Therefore, the area of each abutment in the preferred embodiment is in the range of approximately $8.0\times10^{-5}$ to $1.8\times10^{-4}$ square inches. As a practical matter, a holding face which is planarized by lapping will have abutments with minimum dimensions exceeding five thousandths of an inch (i.e., a minimum abutting area of approximately $2.0\times10^{-5}$ square inches). In the same embodiment, the rim insert 13 which is, for example, made of hardended steel has an edge which is twenty thousandths of an inch wide.

Figure 4:
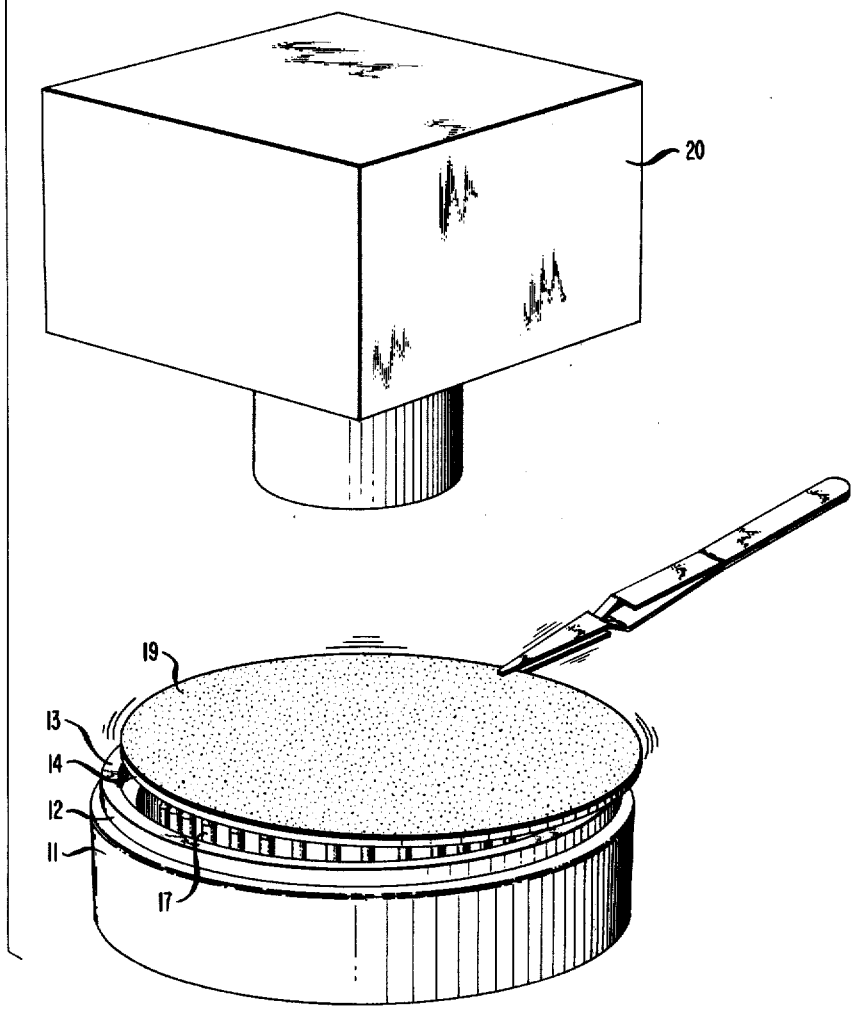
FIG. 4 depicts a wafer being manually loaded onto a wafer holding apparatus.

Still another principle of the invention is that when the wafer is loaded onto the holding face either manually with tweezers or with automatic wafer loading apparatus, some lateral motion is always imparted to the wafer even after the wafer contacts the holding face as illustrated by FIG. 4. This lateral motion is used advantageously in the instant invention to "brush" dirt particles off the pinpoints by ensuring that the diameter of each pinpoint abutment (or the maximum dimension in the case of pinpoints having noncircular shapes) is less than the extent of the lateral motion of the wafer. In the preferred embodiment which is to be used in conjunction with automatic wafer loading apparatus which provides a minimum lateral "scrubbing" motion of at least fifty thousandths of an inch, the diameters of the pinpoints used were, accordingly, made smaller than fifty thousandths of an inch (i.e., the area of each abutment was made less than $2.0\times10^{-3}$ square inches).

Also shown in FIG. 4 is a representation of a conventional pattern exposure apparatus 20 by means of which a high-resolution pattern can be exposed in the layer 19.

Although the particular illustrative embodiment described comprises apparatus for holding circular semiconductor wafers during photolithographic exposure, the invention can also be applied to apparatus for holding other types of thin workpieces with various shapes during other operations such as polishing, grinding and machining. It is to be understood that the terms "abutment" and "pinpoint abutments" as used in the specification and in the claims, includes any localized arbitrary shape having small area in addition to the circular shape shown in the drawing. Moreover, it is to be understood that the term "pins" as used in the specification and claims include column-like members of any cross-sectional shape and of any height, and represent just one of many possible structures for supporting small area localized abutments. Various other modifications may also be made by those skilled in the art without departing from the spirit and scope of this invention. Whichever particular apparatus is selected, it is apparent that the utilization of such an apparatus made in accordance with the principles of the present invention makes possible a method that improves the yield realized in fabricating microminiature devices.

I claim:

1. A vacuum apparatus for holding and planarizing a thin workpiece on a holding face which minimizes the interposition of dirt particles between said workpiece and said holding face, said apparatus comprising:

(a) a baseplate having a rigid raised rim which includes a smooth planar edge surface adapted to support a workpiece having front and back surfaces, said edge surface being adapted to contact the periphery of said back surface to make a substantially airtight seal thereto, thus forming an evacuable chamber enclosed by said baseplate, said rim, and said back surface;

(b) a plurality of [regularly] spaced-apart rigid support members disposed within said chamber, each providing a localized pinpoint abutment with said back surface, said abutments together with said edge surface forming a holding face which is substantially planar, each of said abutments having an area sufficiently small to reduce the probability of dirt particles collecting thereon, evacuation of said chamber producing a pressure difference between said front and back workpiece surfaces forcing said back surface to conform to said holding face, the spacing between adjacent ones of said abutments and the spacing between said abutments nearest said rim and said edge-surface being sufficiently small to prevent significant distortion of the unsupported regions of said workpiece.

2. An apparatus as in claim 1 wherein the area of each of said abutments is in the range of $2.0\times10^{-5}$ to $2.0\times10^{-3}$ square inches.

3. An apparatus according to claim 2 wherein said support members comprise substantially parallel pins mounted in said baseplate and wherein said abutments comprise the points of said pins.

4. An apparatus according to claim 3 wherein said baseplate is made from aluminum, said rim is made from steel, and said pins are made from alumina.

5. In the fabrication of semiconductive devices, a method for positioning and planarizing a substrate wafer having a front and a back surface, said method comprising the steps of:

loosely positioning said wafer in a general position;

applying substantially uniformly distributed forces along said front surface;

applying a multiplicity of localized forces along said back surface, said back surface forces counterbalancing said front surface forces and being sufficient to planarize said wafer;

applying each of said localized forces to an area of said back surface which area is in the range of $2\times10^{-5}$ to $2\times10^{-3}$ square inches;

initially moving said wafer in a direction transverse to that of said localized forces so as to dislodge any dirt particles in contact with said back surface.

6. In the fabrication of semiconductive devices, a method for positioning and planarizing during pattern exposure a substrate wafer having a front surface and a back surface, comprising the steps of:

loading said wafer onto a wafer holding face with wafer loading means, said back surface of said wafer contacting said holding face, *said loading* providing lateral motion to said wafer [with said loading means] when said back surface initially contacts said holding face, supporting said back surface of said wafer with a multiplicity of [regularly] spaced apart rigid pin-point abutments comprising said holding face, said abutments providing a multiplicity of localized support regions all lying in one plane, each of said support regions having a maximum dimension which is less than the extent of said lateral motion of said wafer whereby dirt particles situated on said abutments are brushed off said abutments when said wafer is loaded onto said holding face, while said wafer is so supported, evacuating a region adjacent to said back surface to create a force to hold said wafer against said holding face in a manner that ensures that said front surface exhibits a high degree of planarity, and while said wafer is so positioned and planarized, exposing a high resolution pattern onto said front surface of said wafer.

* * * * *